(12) United States Patent
Yoon et al.

(10) Patent No.: US 8,542,764 B2
(45) Date of Patent: Sep. 24, 2013

(54) POWER AND AREA EFFICIENT SERDES TRANSMITTER

(75) Inventors: Dong J. Yoon, Santa Clara, CA (US);
Dawei Huang, San Diego, CA (US);
Drew G. Doblar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1139 days.

(21) Appl. No.: 12/353,717

(22) Filed: Jan. 14, 2009

(65) Prior Publication Data

US 2010/0177841 A1   Jul. 15, 2010

(51) Int. Cl.
*H04L 27/00* (2006.01)

(52) U.S. Cl.
USPC ............................ 375/295; 375/298; 375/299

(58) Field of Classification Search
USPC ................. 375/229, 230, 231, 232, 234, 295, 375/296, 371, 372, 257, 233; 333/18, 28; 710/305, 308, 310; 711/5, 105, 320, 162; 326/93; 370/241
See application file for complete search history.

(56) References Cited

U.S. PATENT DOCUMENTS

| | | | |
|---|---|---|---|
| 5,809,543 A * | 9/1998 | Byers et al. ................... 711/162 |
| 6,278,731 B1 * | 8/2001 | Galperin ....................... 375/229 |
| 7,013,359 B1 * | 3/2006 | Li ................................. 710/305 |
| 7,177,352 B1 | 2/2007 | Plasterer et al. |
| 7,894,537 B2 * | 2/2011 | Mohiuddin ................... 375/257 |
| 7,949,134 B2 * | 5/2011 | Goergen et al. .............. 380/268 |
| 2003/0189903 A1 * | 10/2003 | Hsu et al. ...................... 370/241 |
| 2005/0174271 A1 * | 8/2005 | Carley .......................... 341/100 |
| 2007/0126479 A1 * | 6/2007 | Hur et al. ........................ 326/93 |
| 2008/0187037 A1 * | 8/2008 | Bulzacchelli et al. ........ 375/233 |
| 2008/0191910 A1 | 8/2008 | Simpson |
| 2008/0192860 A1 * | 8/2008 | Harwood et al. ............. 375/296 |

OTHER PUBLICATIONS

PCT International Search Report with Application No. PCT/US2010/020500 mailed Sep. 30, 2010 (3 pages).

\* cited by examiner

*Primary Examiner* — Daniel Washburn
*Assistant Examiner* — Fitwi Hailegiorgis
(74) *Attorney, Agent, or Firm* — Osha • Liang LLP

(57) ABSTRACT

A system and method include a SerDes transmitter comprising a digital block operating in a digital voltage domain. The digital block can be configured to receive a first group of bits of data in parallel and store history bits from another group of data. The SerDes transmitter can further comprise an analog block operating in an analog voltage domain. The analog block can be configured to receive the first group of bits of data from the digital block, receive the history bits from the digital block, generate a plurality of combinations of bits with one or more bits from the first group of bits and zero or more bits from the history bits, align each combination of bits to a phase of a multi-phase clock; and input each combination into an output driver.

21 Claims, 5 Drawing Sheets

|  | Cursor | Post Cursor 1 | Post Cursor 2 | Post Cursor 3 |
|---|---|---|---|---|
| 1st combination | b5 | b4 | b3 | b2 |
| 2nd combination | b6 | b5 | b4 | b3 |
| 3rd combination | b7 | b6 | b5 | b4 |
| 4th combination | b8 | b7 | b6 | b5 |

Fig. 5

POWER AND AREA EFFICIENT SERDES TRANSMITTER

BACKGROUND

In many of today's integrated circuits (IC's), serializer/deserializer (SerDes) circuits are implemented to enable the ICs to exchange information with each other and with other components at very high data rates. As SerDes IO datarates increase to over 10 Gbps, the high speed datapaths for a transmitter can require multigigahertz clocks with multiple clock phases. As a consequence, the power dissipated in those circuits goes up as the frequency scales up, and for high-end multi-core and highly threaded microprocessors, increasing the I/O and memory bandwidth becomes critical in order to continually feed data into the processor pipelines. To support the ever increasing need for bandwidth, processor designs integrate more and more instances of SerDes transmitter and receiver lanes into the chip die area. As such, reducing the area of replicated circuits has a direct impact on reducing the overall area of SerDes IO and ultimately the total power dissipated in the chips.

SerDes circuits include a transmitter and a receiver, also called a serializer and deserializer. Typically, information is sent from a transmitter on one IC to a receiver on another IC through a series of analog pulses. Specifically, to send a digital bit of information, a transmitter determines whether the bit to be sent is a digital 1 or a digital 0. If the bit is a digital 1, the transmitter generates an analog signal (which may be made up of a single signal or a pair of differential signals) having a positive voltage. If the bit is a digital 0, the transmitter generates an analog signal having a negative voltage. After generating the analog signal, the transmitter sends the analog signal as a pulse having a specific duration to the receiver along a communications link. Upon receiving the analog signal, the receiver determines whether the analog signal has a positive voltage or a negative voltage. If the voltage is positive, the receiver determines that the analog signal represents a digital 1. If the voltage is negative, the receiver determines that the analog signal represents a digital 0. In this manner, the transmitter is able to provide digital information to the receiver using analog signals.

Ideally, the receiver should receive analog pulses that closely resemble the analog pulses that were sent by the transmitter. Unfortunately, due to a pulse response effect that is experienced at high data rates, this ideal cannot be achieved. In fact, the analog signal that is received by the receiver often differs from the pulse that was sent by the transmitter by such a degree that the receiver cannot determine whether the received analog signal represents a digital 1 or a digital 0.

To elaborate upon the concept of a pulse response, reference will be made to the sample pulse response shown in FIG. 1. FIG. 1 shows an example of what may be received by a receiver in response to a single positive-voltage pulse (representing a digital 1) sent by the transmitter. In the example shown in FIG. 1, a pulse, $y(x-4) \geq h0$, is sent by the transmitter at sampling time $x-4$ and a pulse equal to h0 is received by the receiver four time intervals later beginning with sampling time x. Notice that even though the transmitter sent a pulse lasting only a single time interval, the receiver does not receive that pulse at just a single sample time. Instead, the receiver receives an analog signal that lasts for several time intervals. During sampling time x, the received signal has a magnitude of h0. At the next sampling time (x+1), the received signal still has a magnitude of h1. At the next several sampling times, the received signal still has magnitudes of h2, h3, h4, and so on. Thus, even though the transmitter sent a pulse lasting only one time interval, the receiver receives a signal that lasts for many time intervals.

Because of this pulse response effect, a pulse sent in one time interval affects pulses sent at future sampling times. To illustrate, suppose that the transmitter sends another positive-voltage pulse at sampling time x−3, and that this pulse is received by the receiver beginning at sampling time x+1. At sampling time x+1, the receiver would sense the h0 voltage of the pulse sent at sampling time x−3. The receiver would also sense the h1 voltage of the pulse previously sent at sampling time x−4. Suppose further that the transmitter sends another positive-voltage pulse at sampling time x−2, and that this pulse is received by the receiver beginning in sampling time x+2. At sampling time x+2, the receiver would sense the h0 voltage of the pulse sent at sampling time x−2. The receiver would also sense the h1 voltage of the pulse previously at sent sampling time x−3. In addition, the receiver would sense the h2 voltage of the pulse previously sent at sampling time x−4. Thus, the voltage sensed by the receiver at sampling time x+2 is an accumulation of the effects of the pulses sent at sampling times x−4, x−3, and x−2 (and even pulses sent at sampling times before x−4). As this example shows, when the receiver senses a voltage at a sampling time, the receiver does not sense the effect of just one pulse but the accumulation of the effects of multiple pulses.

FIG. 1 shows the pulse response for a single positive-voltage pulse. The pulse response for a single negative-voltage pulse (representing a digital 0) is shown in FIG. 2. Notice that the pulse response of FIG. 2 is similar to the pulse response of FIG. 1 except that the voltages are negative instead of positive. Thus, as shown by FIGS. 1 and 2, the effect that a pulse has on future pulses will depend on whether that pulse is a positive-voltage pulse (representing a digital 1) or a negative-voltage pulse (representing a digital 0). If a pulse is a positive-voltage pulse, then the pulse will add to the voltages of future pulses. Conversely, if the pulse is a negative-voltage pulse, then the pulse will subtract from the voltages of future pulses.

As can be seen from the above discussion, a pulse response can significantly affect the signals that are received by a receiver. Thus, ascertaining the pulse response effect that is experienced by a receiver can be highly desirable in many implementations because armed with knowledge of the pulse response, the pulse response's effects can be compensated for at the transmitter, at the receiver, or both, thus improving the receiver's ability to extract the digital data from the signal. Such compensation can include adjusting the pulse before the pulse is sent based on either preceding pulses or subsequent pulses.

For example, assume that the receiver is configured to detect analog pulses of +1 v (representing a digital 1) and −1 v (representing a digital 0) and assume the transmission delay is 4 time intervals. Because of the pulse response of the system, however, a+1 v pulse sent at sampling times x+10 will not be received at the receiver as a +1V pulse at sampling time x+14 because portions of the signals sent at sampling times x+9, x+8, x+7, etc. will still be sensed by the receiver and portions of the pulse sent at sampling time x+11 might be beginning to be sensed. Thus, in order for the receiver to receive a+1 v pulse at sampling time x+14, the transmitter needs to send a pulse of a different voltage at sampling time x+10. What that different voltage needs to be will depend on the data bits that were sent by the transmitter in previous sampling times (e.g. x+9, x+8, x+7, etc) and the data bits that will be sent in subsequent sampling time (e.g. x+11, etc.). The data bit to be sent (in this example at sampling time x+10) is referred to as the cursor bit. Data bits sent before the cursor bit (in this example, bits sent at sampling times x+9, x+8, and x+7) are referred to as post-cursor bits and bits to be sent after the cursor bit (in this case bits at sampling time x+11, etc.) are referred to as pre-cursor bits. How many pre-cursor and post-cursor bits and which pre-cursor and post cursor bits to use are a matter of design preference.

Depending on the detected pulse response and design preferences, an output driver, such as a current mode driver, of the transmitter might be configured to produce an output for each cursor bit that is a function of the cursor bit, a pre-cursor bit, and two post-cursor bits. Because the cursor bit, pre-cursor bits, and two post-cursor bits will all affect the received signal differently, each will be applied a different weighting, referred to as a tap weighting. For example, the output driver might apply a tap weighting of −0.1 to the pre-cursor bit, 0.6 to the cursor bit, −0.25 to the first post-cursor bit, and −0.05 to the second post-cursor bit, in which case the output would be: $Y = -0.1 \text{pre}1 + 0.6*\text{cur} - 0.25*\text{post}1 - 0.05*\text{post}2$.

For purposes of example, assume the following digital data is to be output by the transmitter and received by the receiver after a four time interval delay.

| TIME | DIGITAL BIT TO BE SENT BY TRANSMITTER | DIGITAL BIT RECEIVED AT RECEIVER |
|---|---|---|
| t1 | 1 | |
| t2 | 1 | |
| t3 | 0 | |
| t4 | 1 | |
| t5 | 1 | 1 |
| t6 | 0 | 1 |
| t7 | 1 | 0 |
| t8 | 0 | 1 |
| t9 | 0 | 1 |
| t10 | 1 | 0 |

Because of the four time interval transmission delay, the digital bit sent at t=1 will be received at t=5, the digital bit sent at t=2 will be received at t=6, and so on. Therefore, in order for the system to transmit a digital 1 at t=5 so that a digital 1 will be received at t=9, the output driver will output a voltage that is a function of the digital bits sent at t=3, t=4, t=5, and t=6. In the case of the digital 1 at t=5, the voltage output by the current mode generator would be $-0.1(-1 \text{ v}) + 0.6*(+1 \text{ v}) - 0.25*(+1 \text{ v}) - 0.05(-1 \text{ v})$ which equals +0.5 v.

Each subsequently transmitted bit will reuse three data bits used by the previously transmitted bit. The pre-cursor bit for the previously transmitted bit will be the cursor bit for the subsequently transmitted bit. The cursor bit for the previously transmitted bit will become the first post-cursor bit for the subsequently transmitted bit. The first post-cursor bit for the previously transmitted bit will become the second post-cursor bit for the subsequently transmitted bit, and a new bit will be the pre-cursor bit for the subsequently transmitted bit. Reducing the physical size and power consumption of the transmitter is desirable when implementing a SerDes transmitter in hardware. Thus, aspects of the present invention include a SerDes transmitter that limits how many reused, i.e. redundant, bits are transmitted across the high speed data path of the transmitter.

SUMMARY OF THE INVENTION

A system and method embodying aspects of the present invention include a SerDes transmitter comprising a digital block operating in a digital voltage domain and an analog block operating in an analog voltage domain. The digital block can be configured to receive a first group of bits of data in parallel from a processing device such as a CPU. The CPU can send the bits of data to the digital block aligned to a rising edge of a single-phase clock. As a new group of bits is received at the digital block, history bits from the first group of bits of data can be stored. The analog block can be configured to receive the new group of bits of data and the history bits stored from the first group of bits from the digital block. From the new bits and the history bits, a plurality of combinations of bits with one or more bits from the new group of bits and zero or more bits from the history bits can be generated without having to transfer redundant bits from the digital block to the analog block. Each combination of the plurality of combination can be aligned to a phase of a multi-phase clock and be input into an output driver. The output driver can apply tap weightings to each bit in the combination of bits and use a current mode driver to generate serialized output pulses.

BRIEF DESCRIPTION OF THE DRAWINGS

The embodiments of the invention described herein are illustrated by way of example, and not by way of limitation, in the figures of the accompanying drawings.

FIG. 5 depicts a matrix of bit combinations.

DETAILED DESCRIPTION OF EMBODIMENT(S)

In the following description, for the purposes of explanation, numerous specific details are set forth in order to provide a thorough understanding of various embodiments of the invention described herein. The embodiments of the invention described herein, however, may be practiced without these specific details. In other instances, well-known structures and devices are shown in block diagram form in order to avoid unnecessarily obscuring the embodiments of the invention described herein.

For purposes of simplicity, various embodiments of the invention shall be described below with reference to a SerDes transmitter that receives eight bits of parallel data from a CPU and outputs serialized data based on a cursor bit and three post-cursor bits. However, the scope of the invention is not limited by such parameters. Consequently, any transmitter configured to receive four, sixteen, or any other number of bits of parallel data can benefit from various aspects of the present invention. Additionally, any transmitter configured to use more or fewer post-cursor bits or different combinations of pre-cursor and post-cursor bits can also benefit from various aspects of the present invention. For example, the present invention can also be implemented with embodiments using one pre-cursor bit and one post-cursor bit.

Figure 1:
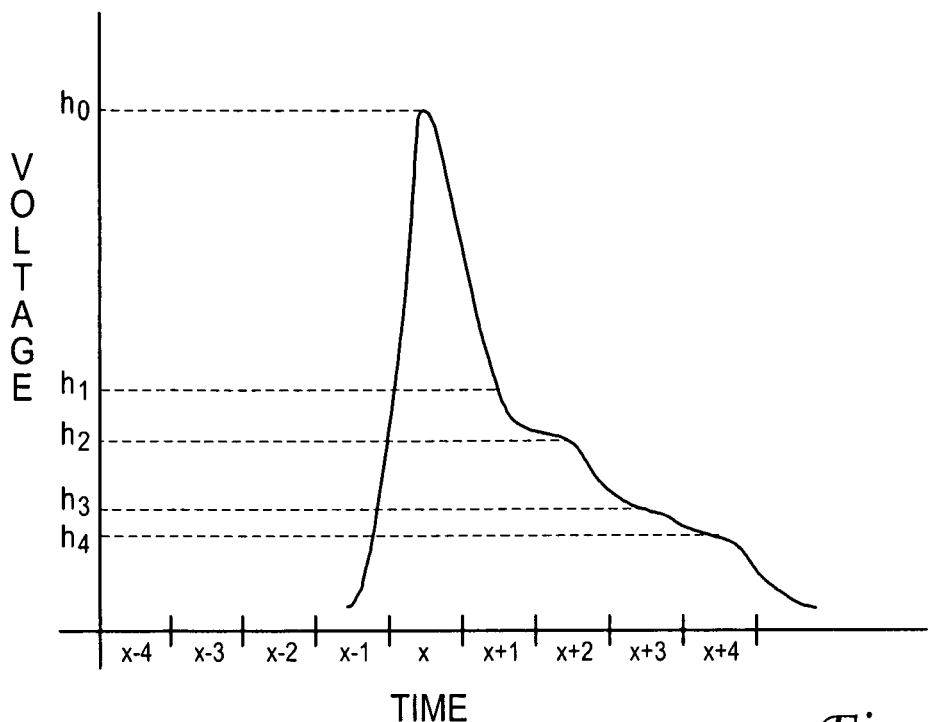
FIG. 1 shows a sample pulse response for a positive-voltage pulse.
Figure 2:
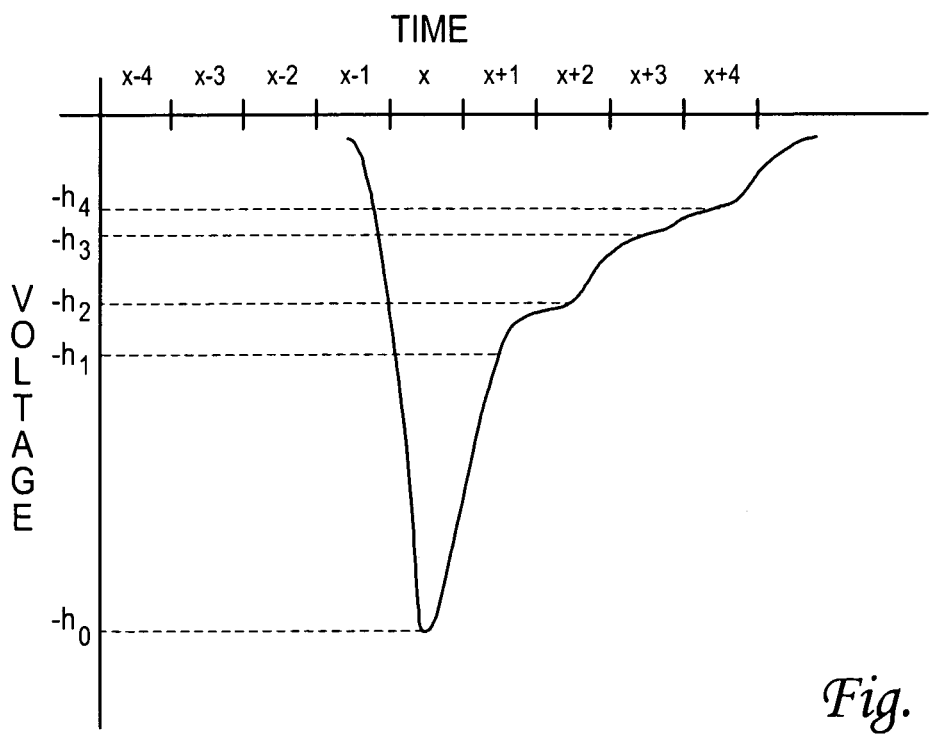
FIG. 2 shows a sample pulse response for a negative-voltage pulse.
Figure 3:
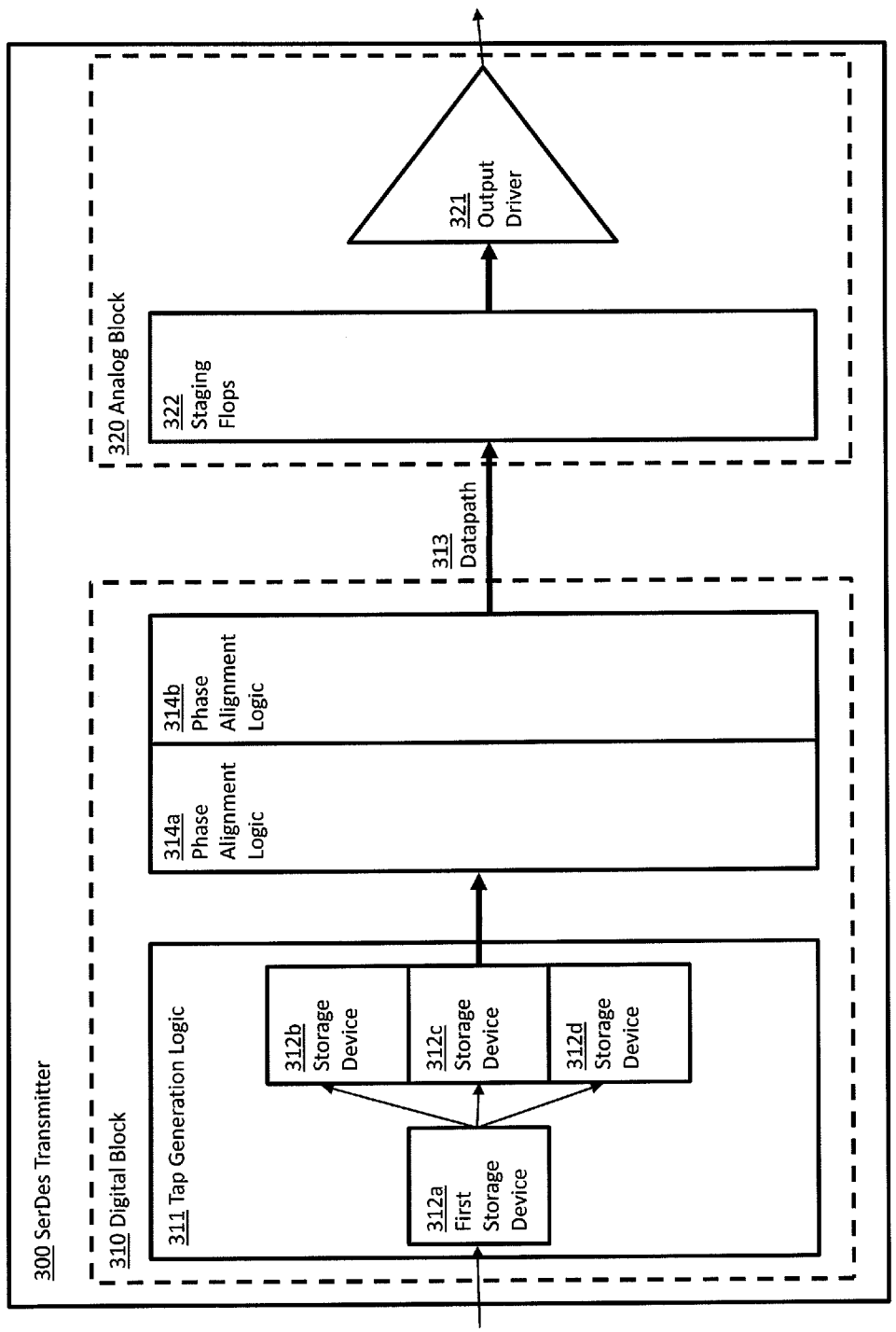
FIG. 3 is a block diagram of a SerDes transmitter embodying aspects of the present invention.

FIG. 3 shows a portion of a SerDes transmitter 300 embodying aspects of the present invention. The SerDes transmitter 300 is configured to generate pulses in accordance with the scheme disclosed. The transmitter 300 comprises a digital block 310 operating in a digital voltage domain and an analog block 320 operating in an analog voltage domain. The digital block 310 receives data from a processor such as a CPU. This example assumes that the processor outputs eight bits of parallel data aligned to a single-phase, 1.56 GHz clock, although in other embodiments, data buses outputting 4, 10, 12, or any other number of bits might also be used. The analog block 320 of the transmitter 300 includes an output driver 321, such as a current mode driver, configured to receive a cursor bit and 3 post cursor bits to generate the output signal of the transmitter 300. The output signal of the transmitter 300 will be a series of analog pulses aligned to a 4-phase, 3.125 GHz clock. Although, the previous example utilized a precursor bit and two post-cursor bits as the history bits and the present example utilizes three post-cursor bits as the history bits, the fundamental principles remain the same.

The transmitter 300 includes a buffer (not shown) to receive from the CPU the eight bits of parallel data aligned to the single-phase, 1.56 GHz clock. The transmitter 300 also contains circuitry (not shown) to deliver the eight bits at half the bus rate but twice the clock rate (i.e. 4 bits of parallel data aligned to a single-phase, 3.125 GHz clock) to tap generation logic 311 in the digital block 310 that is configured to generate four combinations of one cursor bit and three post-cursor bits. The tap generation logic 311 can receive four bits of cursor data and store those four bits in a first storage device 312a such as four flip-flops. Copies of some of those four bits can also be placed into other storage devices 312b-d. When receiving four new data bits into the tap generation logic 311, the previous four bits (now referred to as history bits) in the first storage device 312a can be moved, or "flopped," into the other storage devices 312b-d, such that storage devices 312a-d comprise four combinations of one cursor bit paired with three post-cursor bits.

For example, suppose the first storage element 312a stores bits b4, b3, b2, and b1. As the first storage element 312a is about to receive bits b8, b7, b6, and b5, bit b4 can be flopped to storage elements 312b-d, bit b3 can be flopped to storage elements 312c-d, and bit b2 can be flopped to storage elements 312d. When the tap generation logic 311 receives bits b8, b7, b6, and b5, a copy of bit b7 can be stored in storage element 312b, copies of bit b6 can be stored in storage elements 312b-c, and copies of bit b5 can be stored in storage elements 312b-d.

The result of this flopping and storing is four combinations of one cursor bit with three post-cursor bits. Storage element 312d stores the first combination, which includes bits b5 (cursor) and b4, b3, and b2 (post-cursor). Storage element 312c stores the second combination, which includes bits b6 (cursor) and b5, b4, and b3 (post-cursor). Storage element 312b stores the third combination which includes bits b7 (cursor) and b6, b5, and b4 (post-cursor). Storage element 312a stores the fourth combination, which includes bits b8 (cursor) and b7, b6, and b5 (post-cursor).

Those four combinations (sixteen bits total) can then be sent from the tap generation logic 311 to phase alignment logic 314a-b comprising two stages of sixteen flops. The four combinations can be sent to the phase alignment logic 314a-b in parallel across a 16-bit wide datapath 313 aligned to a single-phase, 3.125 GHz clock. The phase alignment logic 314a-b can align the four combinations to the four phases of a four-phase, 3.125 GHz clock to enable a higher speed data rate.

The four combinations are then sent from the phase alignment logic 314a-b to a set of sixteen staging flops 322 in the analog block 320 in order to remove potential voltage differences caused by the transition from the digital voltage domain to the analog voltage domain. A combination (four bits of data) is sent from the phase alignment logic to the staging flops on each of the four phases of the clock, meaning the data bus 313 between the digital block 310 and the analog block 320 needs to be sixteen bits wide. The four, 4-bit combinations, which each consist of a cursor bit and three post-cursor bits, are then input to the output driver 321 to produce an output signal in accordance with the tap weightings applied to each of the four bits (the cursor bit and the three post-cursor bits). Every voltage output by the analog portion of the transmitter will be generated using 4 bits of data (one cursor and three post-cursor).

Aspects of the present invention can also include a simpler approach in the transmit datapath to help reduce power consumption and lessen area, thus achieving greater efficiency relative to previous generation designs. Observation has shown that much of the data being sent between the digital block 310 and analog block 320 in FIG. 3 is redundant. For example, the first combination of b5, b4, b3, and b2 has three bits in common with the second combination which includes bits b6, b5, b4 and b3. Eliminating this redundant data transfer from the digital block 310 of the transmitter 300 to the analog block 320 of the transmitter 310 can decrease area and power consumption on a chip. For example, the system of FIG. 3 utilizes a 16-bit wide datapath 313 between the digital block 310 and the analog block 320, whereas the datapath in a system embodying aspects of the present invention can achieve the same result with a data path that is only seven bits wide. A system embodying aspects of the invention can also reduce the number of flip-flops and corresponding clock load and distribution used for phase alignment and staging, further reducing area and power consumption.

Figure 4:
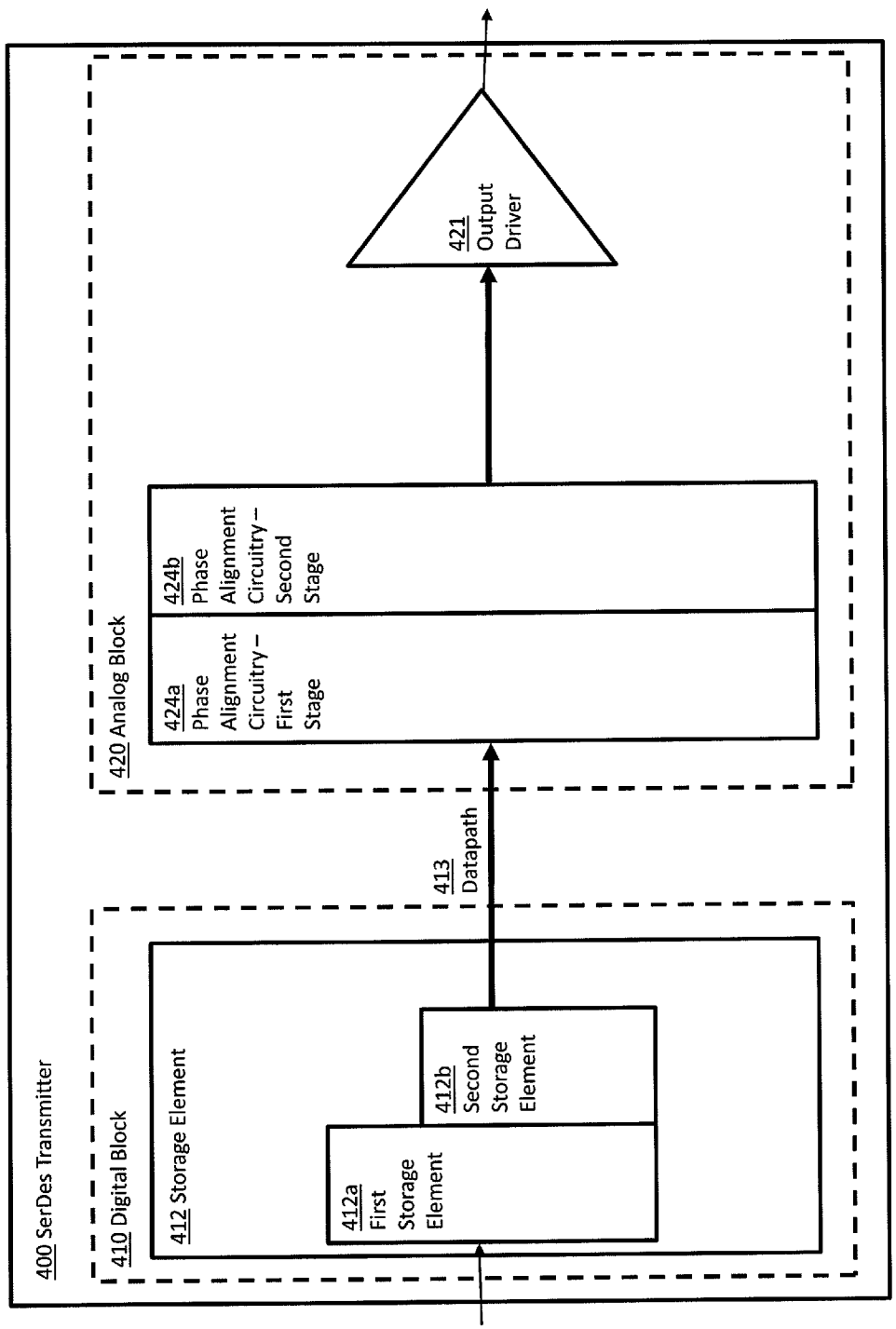
FIG. 4 is a block diagram of a SerDes transmitter embodying aspects of the present invention.

FIG. 4 shows a portion of a SerDes transmitter 400 embodying aspects of the present invention. The transmitter 400 comprises a digital block 410 operating in a digital voltage domain and an analog block 420 operating in an analog voltage domain. The digital block 410 receives data from a processor such as a CPU. This example assumes that the processor delivers to the transmitter 400 eight bits of parallel data on the rising edge of a single-phase, 1.56 GHZ clock, and the transmitter 400 outputs serial data at 12.5 Gbps. The analog block 420 of the transmitter 400 includes an output driver 421 configured to receive a cursor bit and three post cursor bits to generate an output signal.

The transmitter 400 includes circuitry (not shown) for converting the eight parallel bits aligned to a 1.56 GHz, single-phase clock into two sets of four parallel bits aligned to a single-phase, 3.125 GHz clock. The digital block 410 comprises a storage element 412 comprising a first small storage element 412a such as a series of four flip-flops for receiving the four parallel bits. When four new bits are received, three of the previous four bits can be flopped into a second, smaller storage element 412b such as three more flip-flops. These seven bits can then be sent from the storage element 412 to the analog block over a 7-bit wide data bus 413 to generate the four combinations of one cursor bit and three history bits. The seven bits of data can be sent in parallel aligned to a single-phase 3.125 GHz clock.

As an example of how the four combinations can be generated, consider an example, where bits b1, b2, b3 and b4 are stored in the first storage unit 412a. As the first storage unit 412a receives four more bits (b5, b6, b7, and b8), bits b2, b3, and b4 can be shifted into the second storage unit 412b. Bits b2, b3, b4, b5, b6, b7, and b8 can then be transmitted across the 7-bit wide data bus 413 to the analog block 420. The first combination will be bit b5 (cursor) and bits b4, b3, and b2 (post-cursor). The second combination will be bit b6 (cursor), and bits b5, b4, and b3 (post-cursor). The third combination will be bits b7 (cursor), b6, b5, and b4 (post-cursor). The fourth combination will be bits b8 (cursor) and bits b7, b6, and b5 (post-cursor). As can be seen from the chart of FIG. 5, these four combinations only comprise the seven unique bits stored in storage elements 412a-b. As can also be seen from the chart of FIG. 5, an alternate embodiment using only two post cursor bits could generate the four combinations from six unique bits (i.e. bit b2 would not be needed).

The four combinations can be generated in the analog block 420 when the data is captured from the 7-bit wide data bus 413. The analog block 420 includes phase alignment circuitry 424a-b comprising two stages of storage elements. The first stage 424a comprises a storage element such as sixteen flip-flops that can store the four combinations. The four combinations are generated in the first stage 424a on the first phase of a clock, also referred to as phase0. There is a delay between the time the four combinations are generated and the time the combinations can be sent to the output driver 421. Therefore, the first combination will not be sent from the first stage 424a to the output driver 421 until, for example, the fourth phase of the clock, also referred to as phase3. The second combination can be sent from the first stage 424a on the first phase of the next clock cycle, phase0.

At phase0, however, four new combinations are generated in the first stage 424a, meaning the third and fourth combinations will be replaced. In order to avoid losing the third and fourth combinations, the third and fourth combinations are shifted on the third phase of the clock, phase2, into a second stage 424b storage element such as eight flip-flops. The third combination can then be sent from the second stage 424b to the output driver 421 on the second phase, phase1, of the clock, and the fourth combination can then be sent from the second stage 424b to the output driver 421 on the third phase, phase2, of the clock. The result will be that the four combinations will be delivered to the output driver 421 on four consecutive phases of the clock, with the first combination aligned to phase3 of a first clock cycle, the second combination aligned to phase0 of a second clock cycle, the third combination aligned to phase1 of the second clock cycle, and the fourth combination aligned to phase2 of the second clock cycle.

The embodiment of FIG. 4 greatly reduces power consumption and area by utilizing a 7-bit wide data bus 413 between the digital block 410 and the analog 420 block, compared to the 16-bit wide data bus 313 used in FIG. 3. The embodiment of FIG. 4 further reduces power consumption and area by using fewer storage elements along the data path, and reducing the portion of the circuit that operates on the multi-phase clock, which requires more area and power than the single-phase clock.

The embodiment of FIG. 4 also gives a designer greater flexibility in how physically to lay out the circuit because circuit function is moved from the digital block 410, which is typically designed using an automated place and route CAD tool, to the analog block 420, which is typically designed manually.

Figure 6:
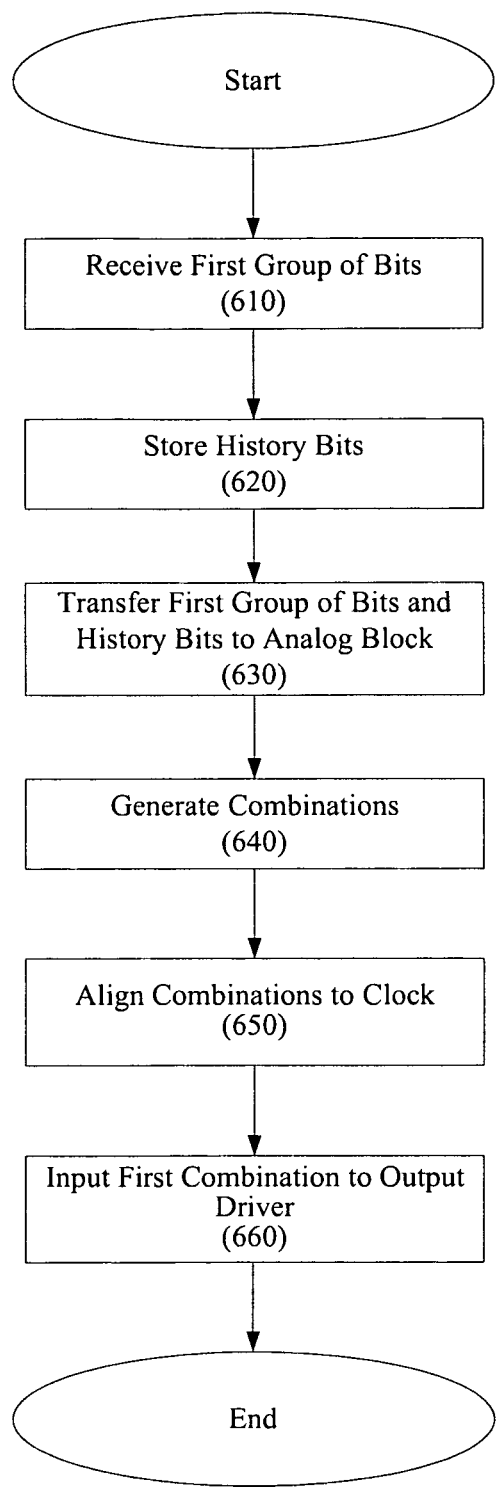
FIG. 6 is a flow chart illustrating a method that embodies aspects of the present invention.

FIG. 6 is a flow chart showing a method of operating a transmitter such as the transmitter depicted in FIG. 4. The digital block of a transmitter can receive a first group of bits, for example from a processor (610). As the digital block is receiving the first group of bits, history bits can be stored (620). The history bits can be one or more bits from a previous group of bits. The history bits and the first group of bits can be transmitted from the digital block of the transmitter to an analog block (630). The transmission can occur across a datapath that is equal in width to the number of history bits and first group of bits stored in the digital block. At the analog block, a plurality of combinations, such as the example combinations shown in FIG. 5, can be generated and stored (640). The stored combinations can then be aligned to the different phases of a multi-phase clock, as discussed above (650). Each combination can then be input into an output driver, such as a current mode driver, so that the output driver can generate an output pulse in accordance with tap weightings applied to the bits in the combination (660).

The SerDes transmitters of FIG. 4 as well as FIG. 3 can be implemented into a variety of electronic components in a variety of systems. For example, the transmitter might be implemented onto a first printed circuit board (PCB) and configured to transmit data to a receiver on a second PCB. The data might be transmitted from the first PCB to the second PCB via a conductive coupling such as a board-to-board (BTB) connector. The BTB connector might, for example, connect conducting terminals on the first PCB to conducting terminals on the second PCB.

In another embodiment, aspects of the present invention might be implemented into an integrated circuit (IC) connected to a PCB via a land grid array (LGA) surface mount or a pin grid array (PGA) surface mount by techniques such as soldering and sockets. In yet other embodiments, the transmitter might be configured to deliver serialized data to a receiver over an electrical cable. The cable might, for example, be connected to a PCB through a cable-to-board connector. In yet another embodiment, aspects of the present invention might be implemented into a processor or application-specific integrated circuit (ASIC) and configured to deliver data to another ASIC to which DRAM are attached as a computer's main memory. In yet another embodiment, aspects of the present invention could be used to allow for more SerDes transmitters and receivers to be implemented into power-limited processor chips and allow a greater chip-to-chip bandwidth within a given chip power budget.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A transmitter comprising: a digital block operating in a digital voltage domain, the digital block comprising:
   a first storage element to store a first group of bits of data in parallel; and
   a second storage element to store history bits from another group of data; and
   an analog block operating in an analog voltage domain, the analog block comprising:
      circuitry to receive the first group of bits of data from the digital block;
      circuitry to receive the history bits from the digital block;
      circuitry to generate a plurality of combinations of bits with one or more bits from the first group of bits and zero or more bits from the history bits;

phase alignment circuitry to align each combination of bits to a phase of a clock; and an output driver to produce an output signal in response to receiving each combination.

2. The transmitter of claim 1, wherein the analog block receives each bit from the first group of bits and each bit from the history bits once during a digital clock cycle.

3. The transmitter of claim 1, wherein the first group of bits and the history bits are sent from the digital block to the analog block aligned to a single-phase clock.

4. The transmitter of claim 1, wherein the digital block operates on a single-phase clock.

5. The transmitter of claim 1, wherein the datapath from the digital block to the analog block is the width of the number of bits in the history bits and the first group of bits.

6. The transmitter of claim 1, wherein the history bits comprise post-cursor bits and pre-cursor bits.

7. The transmitter of claim 1, wherein the output driver generates output signals in accordance with tap weightings applied to each bit in each combination of bits.

8. The transmitter of claim 1, wherein the clock is a multi-phase clock.

9. The transmitter of claim 1, wherein the clock is a single-phase clock.

10. A transmitter comprising: a digital block operating in a digital voltage domain, the digital block comprising:
a first storage element to store a first group of bits;
a second storage element to receive from the first storage element a second group of bits; and
an analog block operating in an analog voltage domain, the analog block comprising:
phase alignment circuitry to receive the first group of bits from the first storage element and the second group of bits from the second storage element, wherein a width of a datapath between the first and second storage elements and the phase alignment circuitry is equal to a total number of bits in the first and second groups of bits; and
an output driver comprising a plurality of staging flops, the output driver configured to receive different combinations of bits from the first and second groups of bits, wherein the different combinations of bits comprises one or more bits from the first group of bits and zero or more bits from the second group of bits.

11. The transmitter of claim 10, wherein the phase alignment circuitry receives each bit from the first and second groups of bits once during a digital clock cycle.

12. The Transmitter of claim 10, wherein the first and second group of bits are sent in parallel from the first and second storage elements to the phase alignment circuitry.

13. The transmitter of claim 10, wherein the first and second group of bits are aligned to a single phase clock when sent from the first and second storage elements to the phase alignment circuitry.

14. The transmitter of claim 10, wherein the output driver generates output signals in accordance with tap weightings applied to each bit within the combinations of bits.

15. The transmitter of claim 10, wherein the phase alignment circuitry is to align each different combination of bits to a phase of a multi-phase clock and the output driver is to output pulses aligned to the phases of the multi-phase clock.

16. The transmitter of claim 10, wherein the phase alignment circuitry is to align each different combination of bits to a phase of a single-phase clock and the output driver is to output pulses aligned to the phases of the single-phase clock.

17. A method comprising:
receiving a first group of bits of parallel data in a digital block;
storing history bits in the digital block;
transferring the first group of bits and the history bits from the digital block to an analog block;
generating in the analog block a plurality of combinations of bits, each combination comprising one or more bits from the first group of bits and zero or more bits from the history bits;
aligning a first combination from the plurality of combinations of bits to a phase of a clock; and
inputting the first combination into an output driver to produce an output signal.

18. The method of claim 17, wherein the digital block operates on a single-phase clock.

19. The method of claim 17, wherein a datapath from the digital block to the analog block is the width of the number of bits in the history bits and the first group of bits.

20. The method of claim 17, wherein the output driver generates output signals in accordance with tap weightings applied to each bit in the first combination.

21. A system comprising:
a first electronic component comprising a receiver;
a connector;
a second electronic component comprising a transmitter configured to transmit data to the first electronic component via the connector, the transmitter comprising:
a digital block operating in a digital voltage domain, the digital block comprising:
a first storage element to store a first group of bits of data in parallel; and
a second storage element to store history bits from another group of data; and
an analog block operating in an analog voltage domain, the analog block comprising:
circuitry to receive the first group of bits of data from the digital block;
circuitry to receive the history bits from the digital block;
circuitry to generate a plurality of combinations of bits with one or more bits from the first group of bits and zero or more bits from the history bits;
phase alignment circuitry to align each combination of bits to a phase of a clock; and
an output driver to produce an output signal in response to receiving each combination.

* * * * *